United States Patent
Chen et al.

(10) Patent No.: US 9,653,826 B2
(45) Date of Patent: May 16, 2017

(54) INTERFACE MOUNTING DEVICE AND PRINTED CIRCUIT BOARD ASSEMBLY WITH THE INTERFACE MOUNTING DEVICE

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Yong-Nian Chen, Wuhan (CN); Li-Fu Xu, Wuhan (CN); Chun-Wei Yang, Wuhan (CN)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 180 days.

(21) Appl. No.: 14/612,978

(22) Filed: Feb. 3, 2015

(65) Prior Publication Data
US 2016/0211594 A1    Jul. 21, 2016

(30) Foreign Application Priority Data
Jan. 20, 2015    (CN) .......................... 2015 1 0026416

(51) Int. Cl.
| | |
|---|---|
| *H05K 7/02* | (2006.01) |
| *H05K 7/04* | (2006.01) |
| *H01R 12/70* | (2011.01) |
| *H05K 1/18* | (2006.01) |

(52) U.S. Cl.
CPC ........... *H01R 12/7076* (2013.01); *H05K 1/18* (2013.01); *H05K 2201/10189* (2013.01)

(58) Field of Classification Search
CPC ........ H05K 7/142; H05K 53/301; H05K 7/06; H05K 3/284; G06F 1/184; G06F 1/185; H06K 3/3447
USPC .......... 361/704, 679.01, 748, 796, 801, 807, 361/809, 810; 439/65–67, 78–79, 296, 439/325, 327, 526–527
See application file for complete search history.

(56) References Cited

U.S. PATENT DOCUMENTS

| | | | |
|---|---|---|---|
| 6,398,587 B1 * | 6/2002 | Chen ................... | H01R 12/7023 439/573 |
| 6,866,544 B1 * | 3/2005 | Casey ................... | H05K 9/0058 439/607.2 |
| 7,883,369 B1 * | 2/2011 | Sun ..................... | H01R 23/6873 439/607.35 |

(Continued)

*Primary Examiner* — Hung S Bui
(74) *Attorney, Agent, or Firm* — Steven Reiss

(57) ABSTRACT

An interface mounting device includes a circuit board with a connector and a bracket configured to receive an interface device and including a hook. The circuit board defines an installation opening and a cutout extending from an edge of the installation opening. The bracket is received in the installation opening. The hook is engaged with the circuit board through the cutout. The bracket defines a guiding slot aligned with the connector. The guiding slot is configured for a coupling portion of the interface device to pass through and coupling to the connector. A printed circuit board assembly with the interface mounting device is also provided.

20 Claims, 5 Drawing Sheets

(56) References Cited

U.S. PATENT DOCUMENTS

| | | | |
|---|---|---|---|
| 8,272,897 B1 * | 9/2012 | Lin | H01R 12/724 439/607.4 |
| 8,465,299 B2 * | 6/2013 | Ho | H01R 13/506 439/607.05 |
| 9,282,669 B2 * | 3/2016 | Yan | H05K 7/1454 |
| 2009/0311895 A1 * | 12/2009 | Chen | H01R 12/721 439/218 |

* cited by examiner

INTERFACE MOUNTING DEVICE AND
PRINTED CIRCUIT BOARD ASSEMBLY
WITH THE INTERFACE MOUNTING
DEVICE

FIELD

The subject matter herein generally relates to an interface mounting device and a printed circuit board with the interface mounting device.

BACKGROUND

A number of interfaces, such as utility smart network access port, are generally secured to a circuit board by screws with a coupling end coupled to a connector secured to the circuit board.

BRIEF DESCRIPTION OF THE DRAWINGS

Implementations of the present technology will now be described, by way of example only, with reference to the attached figures.

DETAILED DESCRIPTION

Figure 1:
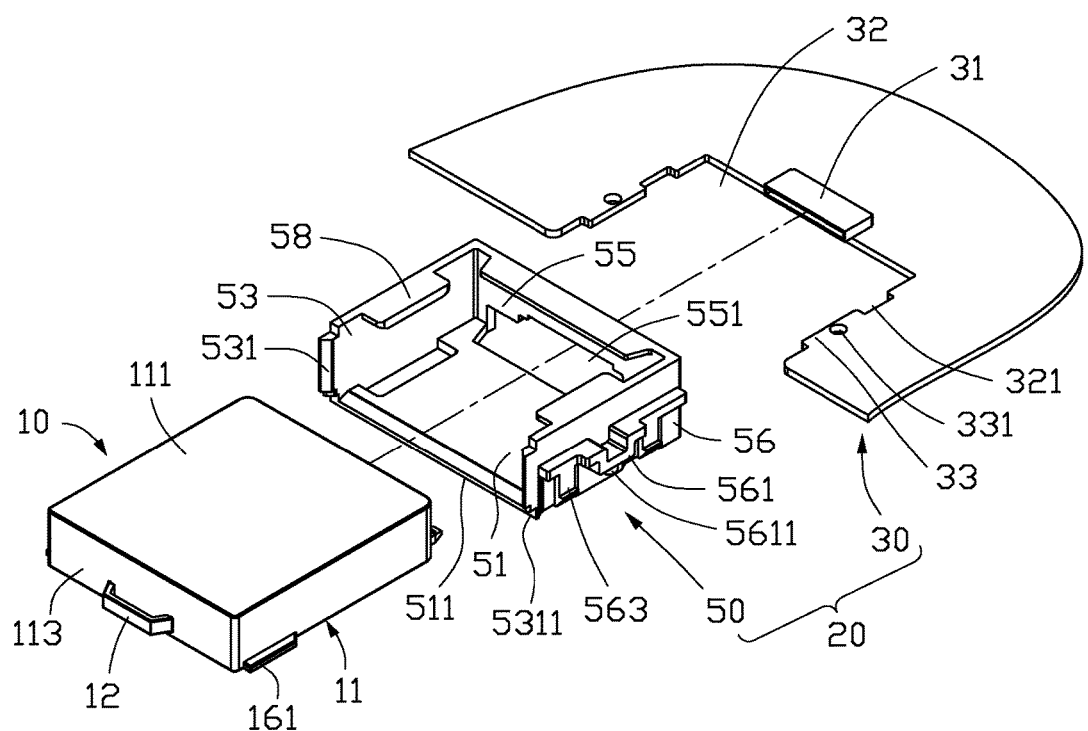
FIG. 1 is an isometric view of an embodiment of a printed circuit board assembly.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

Figure 2:
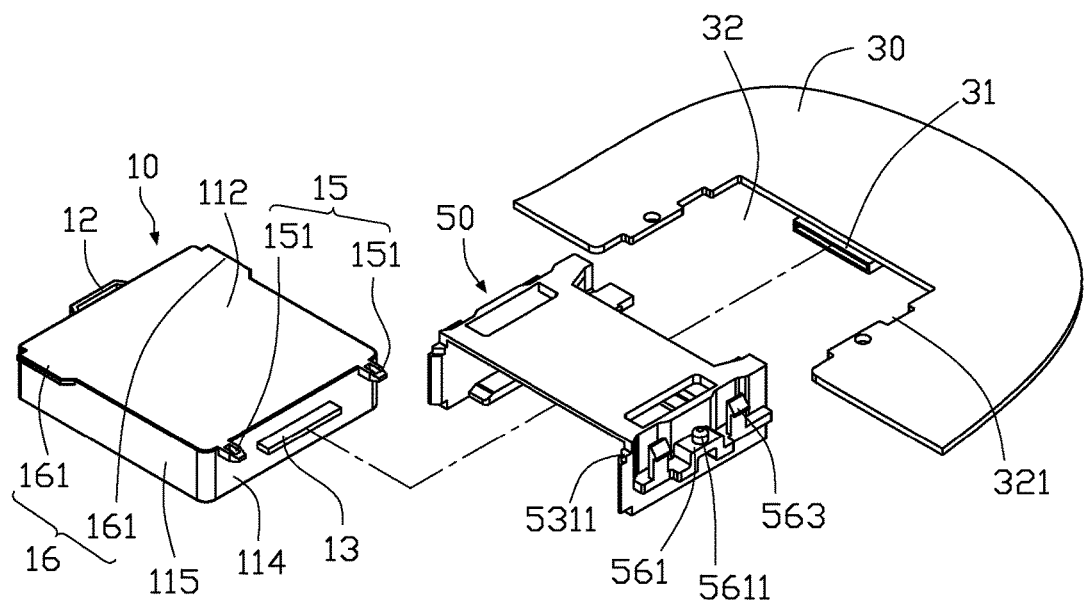
FIG. 2 is similar with FIG. 1, but viewed from a different angle.

FIG. 1 and FIG. 2 illustrate a printed circuit board assembly in accordance with an embodiment including an interface device 10 and an interface mounting device 20 configured to mount the interface device 10.

The interface device 10 can include a case 11, an operation portion 12, a coupling portion 13, a guiding portion 15, and a limiting portion 16.

The case 11 can include a top wall 111, a bottom wall 112 opposite to the top wall 111, a front wall 113, a rear wall 114 opposite to the front wall 113, and two sidewalls 115. In at least one embodiment, the top wall 111 is substantially parallel to the bottom wall 112, the front wall 113 is substantially parallel to the rear wall 114 and perpendicular to the top wall 111, and the sidewall 115 is substantially perpendicular to the top wall 111 and the front wall 113.

The operation portion 12 extends from the front wall 113 away from the rear wall 114. The coupling portion 13 extends from the rear wall 114 away from the front wall 113. The guiding portion 15 includes two guiding blocks 151. Each guiding block 151 extends from an edge of the top wall 111, coupled to the rear wall 114, in a direction substantially perpendicularly to the rear wall 114. The limiting portion 16 includes two limiting pieces 161 extending substantially perpendicularly from a top edge of each sidewall 115.

The interface mounting device 20 can include a circuit board 30 and a bracket 50.

The circuit board 30 secures a connector 31 and defines an installation opening 32 adjacent to the connector 31. Each side edge of the installation opening 32 defines a cutout 321. A positioning piece 33 is located between the two cutouts 321. The positioning piece 33 defines a positioning hole 331.

The bracket 50 can include a covering plate 51, two side plates 53 extending from opposite side edges of the covering plate 51, and a rear plate 55 connected to the covering plate 51 and the two side plates 53. A first guiding rib 511 extends slantingly from a free edge of the covering plate 51. A second guiding rib 531 extends slantingly from a free edge of each side plate 53. The first guiding rib 511 and the second guiding rib 531 are configured for the interface device 10 to be easily inserted. The rear plate 55 defines a guiding slot 551. The guiding slot 551 extends to the covering plate 51. A holding plate 58 extends from the rear plate 55 and each side plate 53. The holding plate 58 is substantially parallel to the covering plate 51. The bracket 50 further includes two positioning plates 56 located outside of the side plates 53 and substantially parallel to the side plate 53. A positioning block 561 and two hooks 563 extend from each positioning plate 56. The positioning block 561 is located between the two hooks 563. A positioning post 5611 protrudes from the positioning block 561. A limiting cutout 5311 is defined in the second guiding rib 531 adjacent to the first guiding rib 511. In at least one embodiment, the limiting cutout 5311 is step-shaped.

Figure 3:
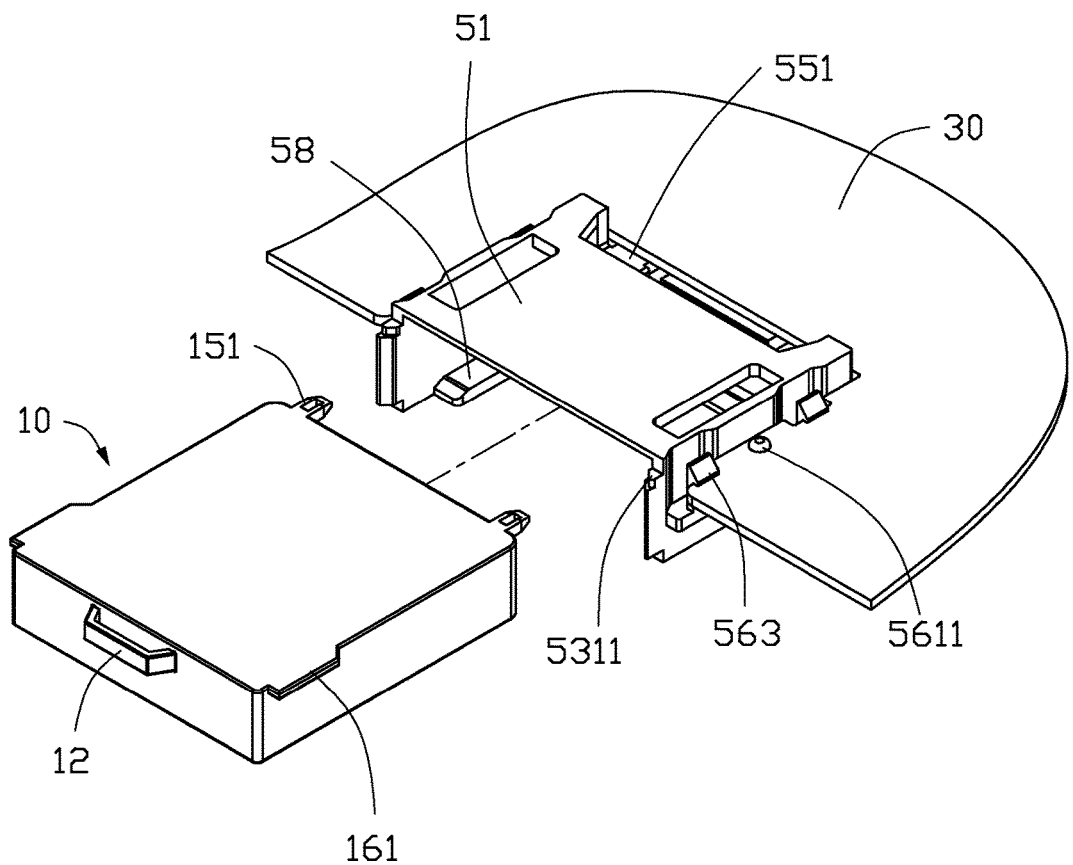
FIG. 3 is an isometric view of an interface mounting device and an interface device of the printed circuit board assembly of FIG. 1.

FIG. 3 illustrates that in assembly of the bracket 50, the bracket 50 is positioned above the circuit board 30 and aligned to the installation opening 32. The bracket 50 is moved in a direction substantially perpendicular to the circuit board 30, the positioning post 5611 is inserted into the positioning hole 331, and the hooks 563 are elastically deformed to be received in the cutouts 321. When the positioning block 561 is blocked by the positioning piece 33, the bracket 50 is released. The hooks 563 extend out of the positioning holes 331 and rebound to engage edges of the positioning hole 331. Thus, the bracket 50 is mounted to the circuit board 30 with the connector 31 aligned to the guiding slot 551.

Figure 4:
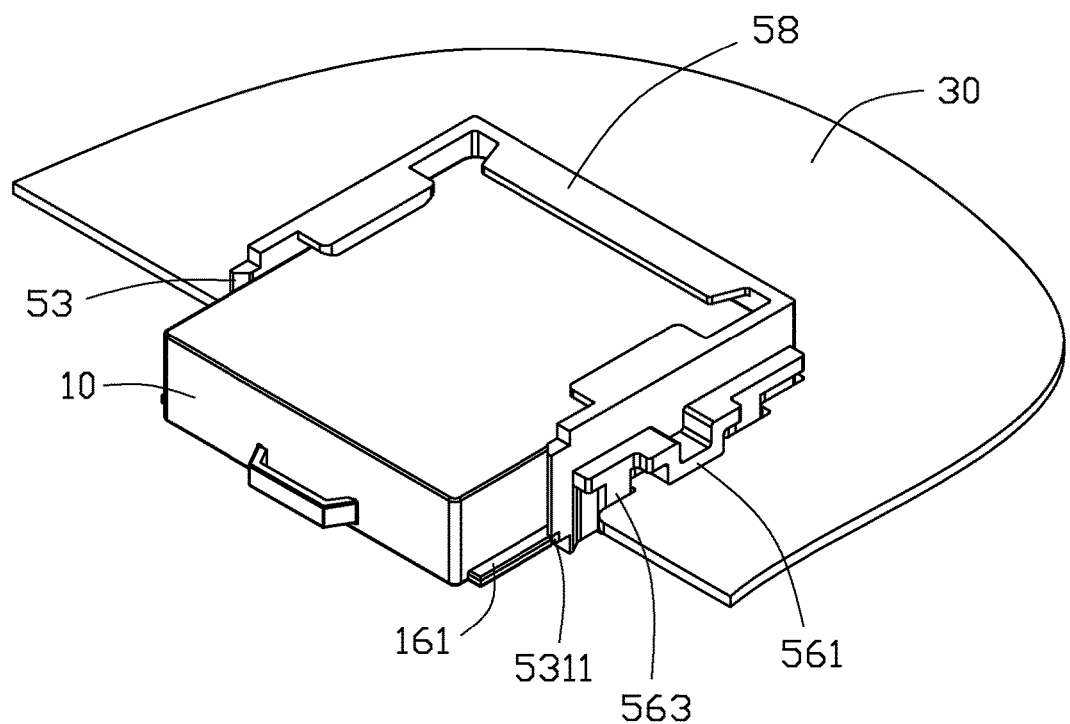
FIG. 4 is an assembled, isometric view of the printed circuit board assembly of FIG. 1.
Figure 5:
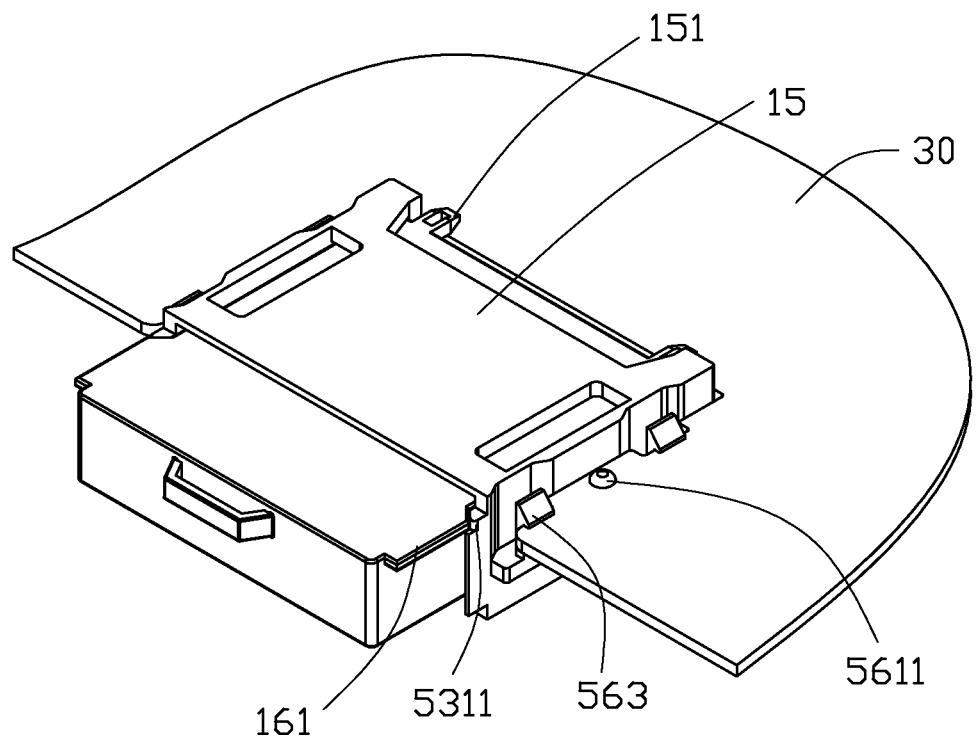
FIG. 5 is similar with FIG. 4, but viewed from a different angle.

FIGS. 4-5 illustrate that when in assembly of the interface device 10, the interface device 10 is inserted into the bracket 50 between the holding plates 58 and the covering plate 51.

The guiding block 151 extends out of the guiding slot 551 and abuts side edge of the guiding slot 551. The interface device 10 is slid towards the connector 31 until the limiting pieces 161 are blocked by edges of the limiting cutouts 5311. The coupling portion 13 is coupled to the connector 31. When the guiding blocks 151 abut side edges of the guiding slot 551, the coupling portion 13 is aligned with the connector 31. When the interface device 10 is slid into the bracket 50, the guiding blocks 151 slide along the guiding slot 551, guiding the coupling portion 13 to couple to the connector 31 correctly.

The guiding blocks 151 are furthered taken as a fool-proof structure. When the interface device 10 is inserted into the bracket 50 in a wrong direction, the guiding blocks 151 will be blocked by the rear plate 55, preventing the interface device 10 from further sliding into the bracket 50. When the coupling portion 13 is coupled to the connector 31, the guiding blocks 151 are located between the covering plate 51 and the circuit board 30 and holds the interface device 10 upon the circuit board 30, preventing coupling pins (not shown) of the connector 31 from being damaged by the coupling portion 13. The edges of the limiting cutouts 5311 block the limiting pieces 161, preventing the interface device 10 from overly inserting into the connector 31 to damage the coupling pins of the connector 31.

The embodiments shown and described above are only examples. Many details are often found in the art such as the other features of an interface mounting device and printed circuit board assembly. Therefore, many such details are neither shown nor described. Even though numerous characteristics and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. An interface mounting device comprising:
   a circuit board with a connector mounted thereon, the circuit board defining an installation opening and a cutout extending from an edge of the installation opening; and
   a bracket received in the installation opening and configured to receive an interface device, the bracket comprising a hook, the hook being engageable with the circuit board through the cutout, the bracket defining a guiding slot aligned with the connector, wherein a coupling portion of the interface device is configured to pass through the guiding slot to couple to the connector; the circuit board defines a positioning hole adjacent to the edge of the installation opening, the bracket further comprises a positioning post, the positioning post is engaged in the positioning hole.

2. The interface mounting device of claim 1, wherein the circuit board comprises a positioning piece extending from the edge of the installation opening, the positioning hole is defined on the positioning piece, the bracket further comprises a positioning block and the positioning post extends from the positioning block.

3. The interface mounting device of claim 2, wherein the bracket comprises a covering plate, two side plates extending from opposite edges of the covering plate, a rear plate connected to the covering plate and the two side plates, and a holding plate extending from each of the rear plate and the side plate in a direction substantially parallel to the covering plate; and the covering plate, the side plates, the rear plate, and the holding plate cooperatively define a receiving space configured to receive the interface device.

4. The interface mounting device of claim 3, wherein the bracket further comprises a positioning plate outside of each side plate, the positioning block and the hook extend from the positioning plate, the positioning block abuts against the circuit board, and the guiding slot is defined in the rear plate.

5. The interface mounting device of claim 3, wherein a first guiding rib extends slantingly from the covering plate, a second guiding rib extends slantingly from each side plate, the second guiding rib defines a limiting cutout configured to abut a limiting piece of the interface device, blocking the interface device from inserting into the bracket.

6. The interface mounting device of claim 5, wherein the cutout is substantially step-shaped.

7. A printed circuit board assembly comprising:
   an interface device comprising a coupling portion; and
   an interface mounting device, comprising:
      a circuit board with a connector mounted thereon; and
      a bracket receiving the interface device and comprising a hook;
   wherein the circuit board defines an installation opening and a cutout extending from an edge of the installation opening; the bracket is received in the installation opening, the hook is engaged with the circuit board through the cutout; and the bracket defines a guiding slot aligned with the connector, and the coupling portion is coupled to the connector through the guiding slot; the circuit board defines a positioning hole adjacent to the edge of the installation opening, the bracket further comprises a positioning post, the positioning post is engaged in the positioning hole.

8. The printed circuit board assembly of claim 7, wherein the circuit board comprises a positioning piece extending from the edge of the installation opening, the positioning hole is defined on the positioning piece, the bracket further comprises a positioning block and the positioning post extends from the positioning block.

9. The printed circuit board assembly of claim 8, wherein the bracket further comprises a covering plate, two side plates extending from opposite edges of the covering plate, a rear plate connected to the covering plate and the two side plates, and a holding plate extending from each of the rear plate and the side plate in a direction substantially parallel to the covering plate; and the covering plate, the side plates, the rear plate, and the holding plate cooperatively define a receiving space receiving the interface device.

10. The printed circuit board assembly of claim 9, wherein the bracket further comprises a positioning plate outside of each side plate, the positioning block and the hook extend from the positioning plate, the positioning block abuts against the circuit board, and the guiding slot is defined in the rear plate.

11. The printed circuit board assembly of claim 9, wherein a first guiding rib extends slantingly from the covering plate, a second guiding rib extends slantingly from each side plate, the second guiding rib defines a limiting cutout; the interface device further comprises a case and a limiting portion extending from a sidewall of the case, the case is received in the receiving space, and the limiting portion abuts edges of the limiting cutout, blocking the interface device from inserting into the bracket.

12. The printed circuit board assembly of claim 11, wherein the cutout is substantially step-shaped.

13. The printed circuit board assembly of claim 11, wherein the guiding portion extends from a rear wall of the case, and the rear wall is substantially perpendicular to the sidewall.

14. A printed circuit board assembly comprising:
an interface device comprising a coupling portion and a guiding portion; and
an interface mounting device, comprising:
a circuit board with a connector mounted thereon; and
a bracket receiving the interface device and comprising
a hook and a covering plate substantially parallel to the circuit board;
wherein the circuit board defines an installation opening and a cutout extending from an edge of the installation opening; the bracket is received in the installation opening, the hook is engaged with the circuit board through the cutout; and the bracket defines a guiding slot aligned with the connector, the coupling portion is coupled to the connector through the guiding slot; and the guiding portion extends out of the guiding slot between the covering plate and the circuit board.

15. The printed circuit board assembly of claim 14, wherein the circuit board further comprises a positioning piece extending from the edge of the installation opening, the positioning piece defines a positioning hole, the bracket further comprises a positioning block and a positioning post extending from the positioning block, and the positioning post is engaged in the positioning hole.

16. The printed circuit board assembly of claim 15, wherein the bracket further comprises two side plates extending from opposite edges of the covering plate, a rear plate connected to the covering plate and the two side plates, and a holding plate extending from each of the rear plate and the side plate in a direction substantially parallel to the covering plate; and the covering plate, the side plates, the rear plate, and the holding plate cooperatively define a receiving space receiving the interface device.

17. The printed circuit board assembly of claim 16, wherein the bracket further comprises a positioning plate outside of each side plate, the positioning block and the hook extend from the positioning plate, the positioning block abuts against the circuit board, and the guiding slot is defined in the rear plate.

18. The printed circuit board assembly of claim 16, wherein a first guiding rib extends slantingly from the covering plate, a second guiding rib extends slantingly from each side plate, the second guiding rib defines a limiting cutout; the interface device further comprises a case and a limiting portion extending from a sidewall of the case, the case is received in the receiving space, and the limiting portion abuts edges of the limiting cutout, blocking the interface device from inserting into the bracket.

19. The printed circuit board assembly of claim 18, wherein the limiting cutout is substantially step-shaped.

20. The printed circuit board assembly of claim 18, wherein the guiding portion extends from a rear wall of the case, and the rear wall is substantially perpendicular to the sidewall.

* * * * *